United States Patent
Schulze et al.

(10) Patent No.: US 9,054,035 B2
(45) Date of Patent: Jun. 9, 2015

(54) INCREASING THE DOPING EFFICIENCY DURING PROTON IRRADIATION

(71) Applicant: Infineon Technologies AG, Neubiberg (DE)

(72) Inventors: Hans-Joachim Schulze, Taufkirchen (DE); Johannes Laven, Taufkirchen (DE); Franz Josef Niedernostheide, Hagen a. T.W. (DE); Frank Dieter Pfirsch, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/057,671

(22) Filed: Oct. 18, 2013

(65) Prior Publication Data

US 2014/0151858 A1    Jun. 5, 2014

(30) Foreign Application Priority Data

Oct. 23, 2012 (DE) .......................... 10 2012 020 785

(51) Int. Cl.
| | |
|---|---|
| *H01L 21/265* | (2006.01) |
| *H01L 21/263* | (2006.01) |
| *H01L 21/324* | (2006.01) |
| *H01L 29/36* | (2006.01) |
| *H01L 29/167* | (2006.01) |

(52) U.S. Cl.
CPC ........ *H01L 21/26513* (2013.01); *H01L 21/263* (2013.01); *H01L 21/3242* (2013.01); *H01L 29/36* (2013.01); *H01L 29/167* (2013.01)

(58) Field of Classification Search
CPC ..................................... H01L 21/265
USPC ............................. 438/528; 148/33; 257/655
See application file for complete search history.

(56) References Cited

U.S. PATENT DOCUMENTS

| | | | | |
|---|---|---|---|---|
| 3,830,668 | A * | 8/1974 | Dearnaley et al. ............ | 438/480 |
| 4,806,497 | A * | 2/1989 | Adam et al. .................. | 438/139 |
| 7,195,994 | B2 * | 3/2007 | Schulze et al. ............... | 438/514 |
| 7,675,108 | B2 * | 3/2010 | Schulze et al. ............... | 257/328 |
| 7,696,605 | B2 * | 4/2010 | Schulze et al. ............... | 257/608 |
| 7,781,294 | B2 * | 8/2010 | Mauder et al. ............... | 438/308 |
| 8,076,173 | B2 * | 12/2011 | Nemoto ........................ | 438/91 |
| 8,101,506 | B2 * | 1/2012 | Schulze et al. ............... | 438/474 |
| 8,395,244 | B2 * | 3/2013 | Vobecky et al. .............. | 257/655 |
| 8,766,413 | B2 * | 7/2014 | Nemoto et al. ............... | 257/655 |
| 2006/0073684 | A1 * | 4/2006 | Schulze et al. ............... | 438/514 |

* cited by examiner

*Primary Examiner* — George Fourson, III
(74) *Attorney, Agent, or Firm* — Shumaker & Sieffert, P.A.

(57) ABSTRACT

A description is given of a method for doping a semiconductor body, and a semiconductor body produced by such a method. The method comprises irradiating the semiconductor body with protons and irradiating the semiconductor body with electrons. After the process of irradiating with protons and after the process of irradiating with electrons, the semiconductor body is subjected to heat treatment in order to attach the protons to vacancies by means of diffusion.

7 Claims, 3 Drawing Sheets

Doping    Vacancies

Doping    Vacancies

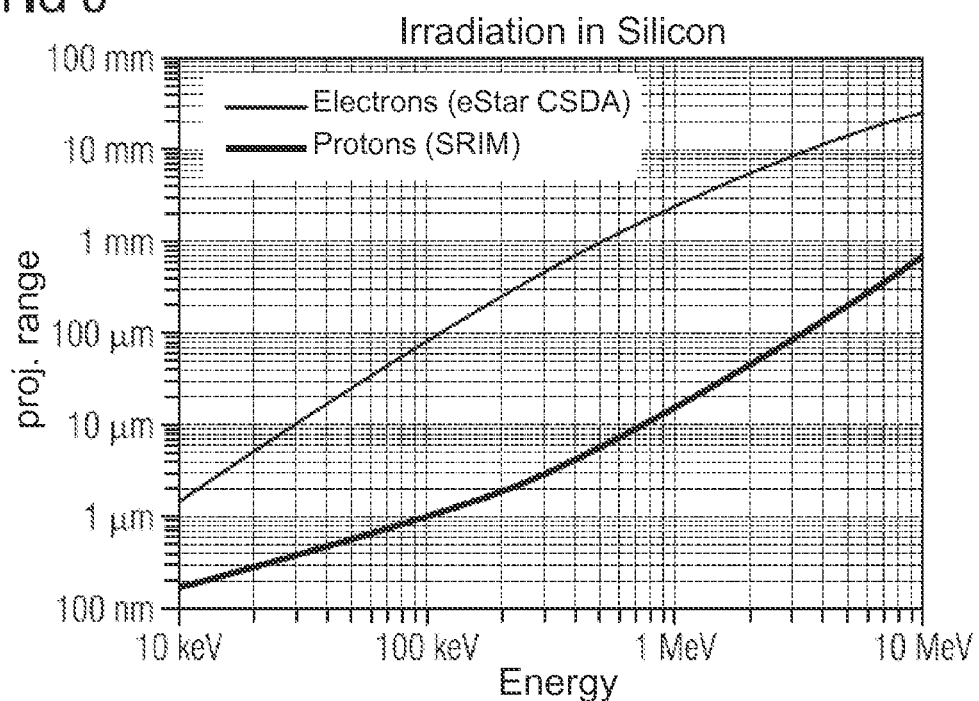
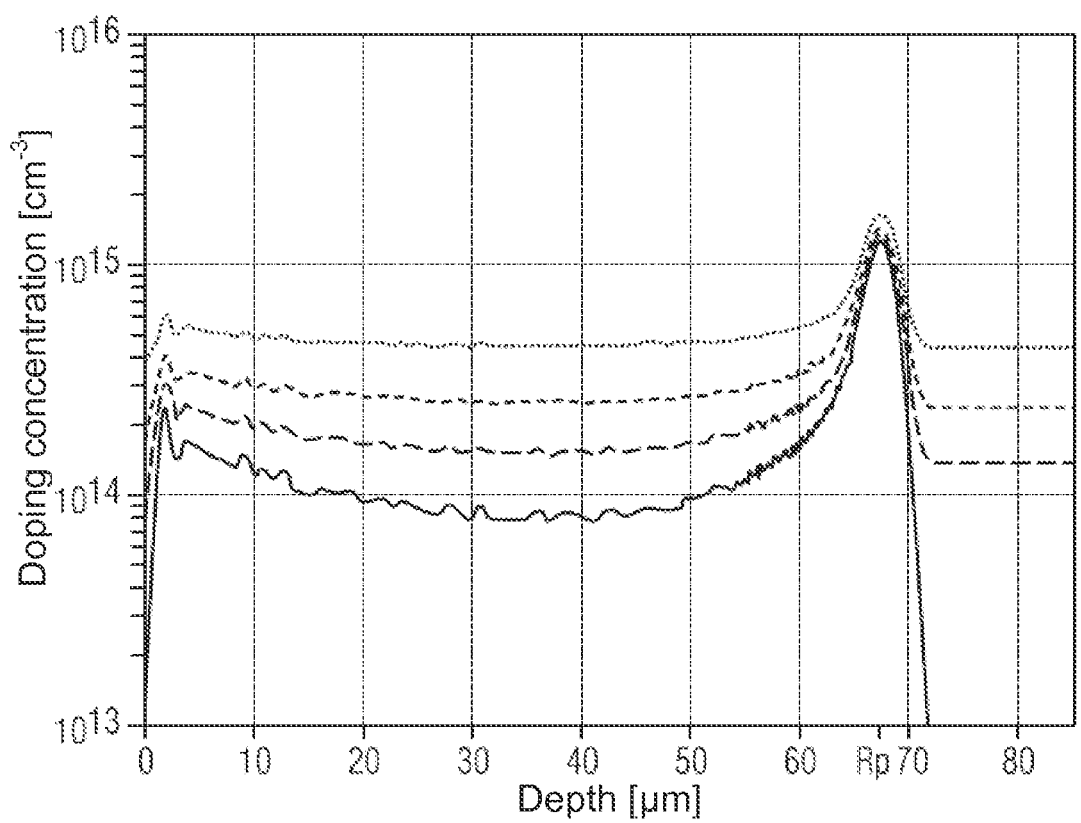

INCREASING THE DOPING EFFICIENCY DURING PROTON IRRADIATION

FIELD OF THE INVENTION

The present disclosure relates to a method for doping semiconductors, and to semiconductor components produced by such a method.

INTRODUCTION

In the production of semiconductor components, for the desired function it is necessary to be able to set the electrical conductivity of the semiconductor material as precisely as possible. The electrical conductivity is set by the semiconductor material being doped with suitable impurity atoms. Either an n-type doping or a p-type doping is thereby achieved. An n-type or p-type doping can be effected by introducing impurity atoms of higher valency (n-type doping) or lower valency (p-type doping) into the crystal structure of the semiconductor.

It is also possible to achieve an n-type doping by means of irradiating the semiconductor with protons. Such proton irradiation can be used in particular for the n-type doping of silicon.

SUMMARY

In one aspect, this disclosure provides a method for doping by means of proton irradiation.

For this purpose, the present disclosure proposes a method and a device for doping a semiconductor body.

The method for doping a semiconductor body comprises irradiating the semiconductor body with protons and irradiating the semiconductor body with electrons. After the process of irradiating with protons and after the process of irradiating with electrons, the semiconductor body is subjected to heat treatment. The heat treatment results in diffusion of the hydrogen atoms produced from the protons radiated in order that said hydrogen atoms are attached to vacancies. The electron irradiation produces additional vacancies that can be decorated by hydrogen atoms.

BRIEF DESCRIPTION OF THE FIGURES

FIG. 3 shows the range of electrons and protons in silicon as a function of the respective incident energy; and FIG. 4 shows doping concentration profiles in proton-irradiated silicon with and without additional electron irradiation.

DETAILED DESCRIPTION

Figure 1:
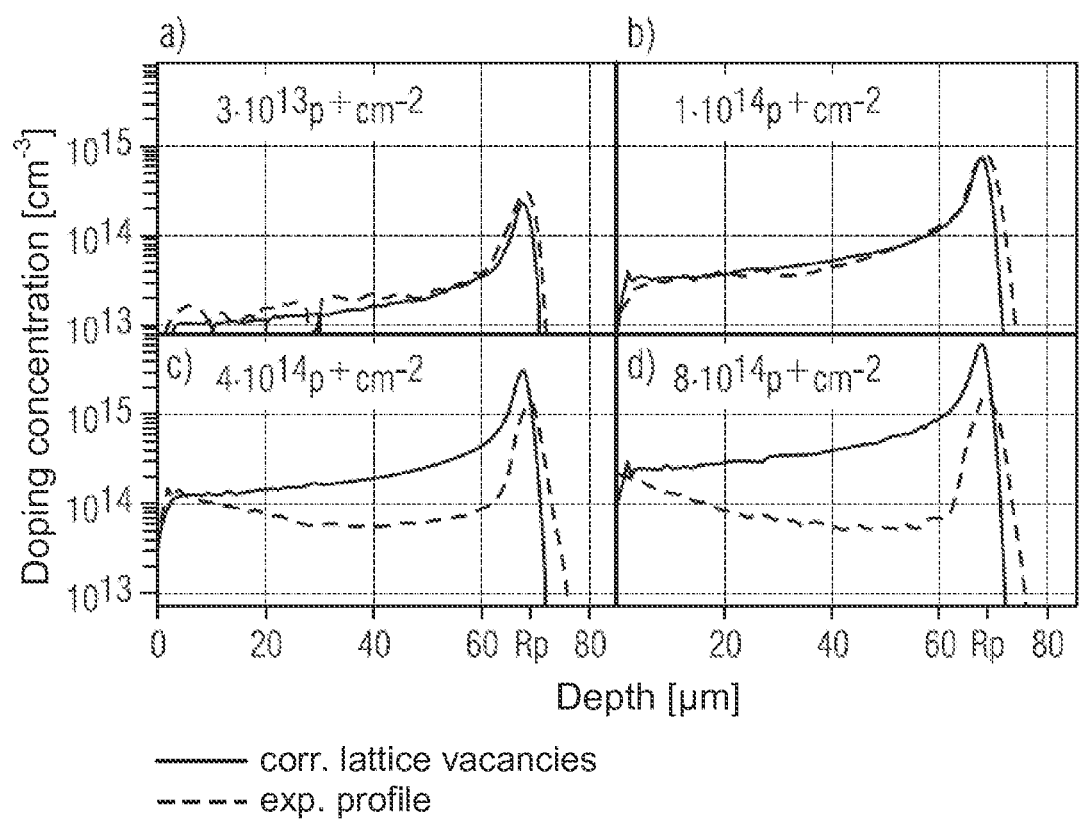
FIG. 1 shows measured doping concentration profiles in proton-irradiated silicon.

Exemplary embodiments of the invention are explained in greater detail below, with reference to the accompanying figures. However, the invention is not restricted to the embodiments specifically described, but rather can be more suitably modified and altered. It lies within the scope of the invention to combine individual features and feature combinations of one embodiment with features and feature combinations of another embodiment in order to arrive at further embodiments according to the invention.

Identical elements are provided with the same or similar reference signs in the figures. A repeated description of these elements has been dispensed with in order to avoid repetition. Furthermore, the figures are not necessarily true to scale. Indicated orientations and directions such as "vertical, "lateral", "top", "bottom" refer to the customary description in the case of semiconductors and are not restricted to an installation direction or an orientation of the semiconductor component.

The basic principle presented here will be elucidated on the basis of the examples given below.

Proton irradiation is used for the n-type doping of semiconductors, in particular of silicon. The irradiated protons form as hydrogen atoms complexes with crystal defects, crystal vacancies and possibly further impurity atoms, such as e.g. oxygen or carbon. The complexes act as electron donors and thus provide an n-type doping. Proton irradiation is usually used with silicon, but can also be used with other semiconductor materials, such as e.g. silicon carbide, e.g. (SiC), which can be doped by means of proton irradiation.

It has been found that the protons irradiated into semiconductor attach as hydrogen atoms in defects, and in particular to vacancies of a silicon lattice. Such vacancies are produced by the irradiated protons during proton irradiation.

Proton radiation, like other ion radiation, too, has a typical penetration characteristic with a maximum range—dependent on the irradiation energy—in the material irradiated with the proton radiation, up to which maximum range the protons can penetrate into the material. The maximum range of the irradiated protons in a semiconductor substrate and thus the maximum penetration depth ($R_p$) is determined, as is generally the case for ion radiation, by the energy of the irradiated protons.

What is characteristic of proton irradiation is that a high concentration of vacancies is formed in the region of the maximum penetration depth ($R_p$). After the implanted hydrogen has been attached to the vacancies formed, this results in a characteristic maximum of the doping concentration in the region of the maximum penetration depth of the protons. No vacancies are produced in a region of greater depth in the substrate, that is to say, behind the maximum penetration depth. The terms "in front of" and "behind" refer here to the direction in which the protons are irradiated into the substrate.

By introducing hydrogen by means of proton irradiation, it is possible to dope a semiconductor up to the maximum penetration depth. The doping has a typical maximum at a depth $R_P$ directly after the irradiation in the region of the maximum penetration depth, but said maximum is not stable, in particular not thermally stable. Said maximum can be used in the semiconductor component. The semiconductor can also be thinned, such that the maximum is no longer contained in the thinned semiconductor component.

By means of subsequent thermal treatment (heat treating, annealing), it is possible to increase the diffusion of the hydrogen in the semiconductor and the irradiated hydrogen can diffuse to vacancies produced by the proton radiation and can be attached there. Since the proton irradiation produces vacancies only in the region in front of and up to the maximum penetration depth, the hydrogen can be attached there, in particular. In the region behind the maximum, by contrast, usually only a low to very low concentration of vacancies and thus also only a low doping concentration can be achieved.

The achievable doping concentrations are dependent on the proton dose during proton irradiation. The maximum doping concentration achievable with proton irradiation is limited, however.

Experimentally measured doping profiles achievable with proton irradiation are illustrated for various proton doses for silicon in FIGS. 1a to 1d.

Typically, the doping concentration in the region through which radiation passes in front of the peak follows well the profile of the vacancies produced by the proton irradiation, as long as the implantation dose is not excessively high. Consequently, the doping concentration for implantation doses has a monotonic rise with increasing depth, at least as long as implantation doses are not excessively high. By means of the implantation dose, it is possible to satisfactorily vary the desired doping concentration in this region. This can be seen in FIGS. 1a and 1b, in which firstly in each case the weakly monotonic rise in the doping concentration in the region between the semiconductor surface (0 µm) and the start of the peak region (at approximately 50 µm) can be discerned and secondly a significant increase in doping from approximately $1*10^{13}$ cm$^{-3}$ (FIG. 1a) to approximately $5*10^{13}$ cm$^{-3}$ (FIG. 1b) at the depth of 20 µm becomes apparent as a result of an increase in the implantation dose by a factor of approximately 3.3.

With the proton irradiation and the subsequent heat treatment, in silicon it is possible to achieve doping concentrations of up to approximately $5*10^{13}$ cm$^{-3}$ in the region in front of the maximum and up to approximately $10^{15}$ cm$^{-3}$ in the region of the maximum, as illustrated in FIGS. 1a and 1b. Up to this region, the doping concentration proceeding from the irradiated side of the semiconductor initially rises slightly, and then rises more greatly depending on the annealing time up to the maximum at the maximum penetration depth. If the maximum in the semiconductor is undesired, it is also possible, by means of higher proton energy, to shift the maximum to a depth greater than the final thickness of the component. The component can also be thinned, for example grinded or eroded, to a thinner thickness after processing, such that the maximum is removed in the process.

The above-described method is satisfactory up to a doping concentration in the region in front of the maximum of approximately $5*10^{13}$ cm$^{-3}$. A further increase in the doping concentration can be achieved by increasing the proton dose within limits. In a range of the doping concentration of $10^{14}$ cm$^{-3}$ to $10^{15}$ cm$^{-3}$, the doping efficiency decreases greatly. In this case, a negative concentration gradient with increasing substrate depth occurs, as illustrated in FIGS. 1c and 1d. It is also not possible to further increase the doping concentration to any values. Rather, it has been found that a further increase in the proton dose during irradiation can even lead to a reduction of the doping concentration (FIG. 1d) and to a non-uniform doping distribution, since a flip takes place in the event of an excess of hydrogen in the region through which radiation passes. In this case, the doping concentration can have a minimum in the region of a depth in front of the maximum at approximately 60-80% of the depth $R_p$.

The proton doping is generally limited by the number of vacancies remaining after the irradiation and heat treatment. The inventors have found that the reduction of the doping concentration at high proton doses can be attributed to a surplus of hydrogen atoms in relation to the vacancies present or produced in the silicon. The surplus of hydrogen leads to excess decoration of the produced complexes acting as electron donors and to the deactivation thereof.

The doping efficiency can be considerably increased by providing additional irradiation with electrons. The irradiation with electrons, independently of the proton irradiation, produces additional vacancies or vacancy complexes V in the semiconductor lattice. Hydrogen atoms can then be attached to these vacancies or vacancy complexes V. The unfavourable ratio of free hydrogen atoms to vacancies is shifted towards more vacancies, which considerably increases the doping efficiency. The electron irradiation is particularly effective if it is carried out before the annealing or heat treatment of the semiconductor, with the result that the vacancies or vacancy complexes are already available when the hydrogen atoms or protons diffuse during the heat treatment. For the sake of simplicity, the term vacancy is used here instead of the term vacancy complexes.

The electron irradiation can be effected before and/or after the proton irradiation, or else simultaneously. It is advantageous, however, if both irradiations, the proton irradiation and the electron irradiation, are effected before the common heat treatment. This means that only one heat treatment step is required and the vacancies are already available when the diffusion of the introduced hydrogen atoms or protons is increased by the temperature increase during the heat treatment. The electron irradiation can be performed in a separate process before or after the proton irradiation. By way of example, it is possible to carry out the electron irradiation and the subsequent heat treatment outside a clean room and in a downstream work step. The requirements made of the production process are thus reduced.

In addition to the electron irradiation, it is also possible to increase the number and density of the vacancies in some other way, for example by supplementary proton irradiation or irradiation with other atoms such as neutrons or helium, but this is more complex than irradiation with electrons.

FIG. 2 shows various steps of a method for doping a semiconductor body. FIG. 2a shows on the left-hand side a semiconductor body 2 before irradiation with protons or electrons. In this example, the semiconductor body 2 has no or a low doping concentration and a low vacancy density, as illustrated qualitatively in the diagrams on the right-hand side. The semiconductor body 2 can be a semiconductor wafer. The semiconductor body 2 can already be at least partially patterned. In the case of a patterned semiconductor body 2, the semiconductor body can comprise different regions. Regions can comprise at least one of a polycrystalline region, a metallization, an oxide, an epitaxially grown region, a traditionally doped region or a combination thereof.

Figure 2A:
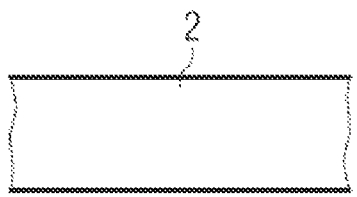
FIGS. 2A-2D are a series of conceptual diagrams demonstrating one example of the present disclosure.
Figure 2E:
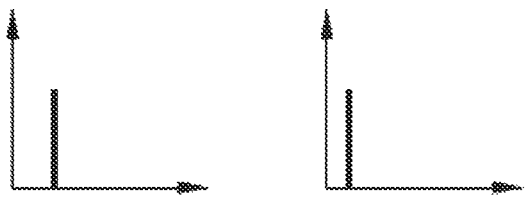
FIG. 2E is a set of two graphs showing doping vacancies.
Figure 2B:
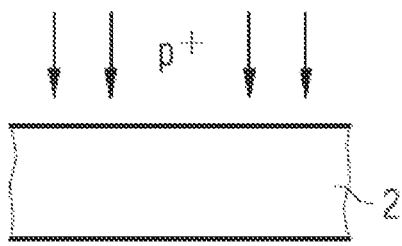

The semiconductor body 2 is then irradiated with protons, as illustrated on the left-hand side in FIG. 2b. As usual for ion irradiation, the irradiated protons give rise to a pronounced maximum of vacancies and hydrogen atoms in the region of the depth d. As a result of the ion irradiation, vacancies are additionally produced in the region through which the proton radiation passes up to the maximum penetration depth, the vacancy density likewise having a maximum in the region of the depth d. It is substantially constant in the region in front of that, whereas no vacancies are produced in deeper regions.

Figure 2C:
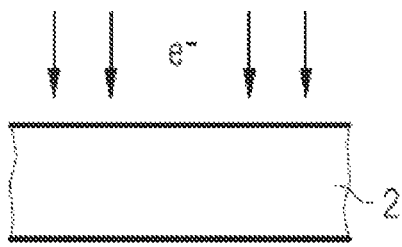

FIG. 2c shows irradiation of the semiconductor body with electrons, which is effected here after the proton irradiation, if appropriate also with intermediate storage or transport. In this example, the maximum penetration depth of the electrons is greater than the thickness of the semiconductor body 2. The electron irradiation does not change the hydrogen concentration. However, the electron irradiation produces additional vacancies over the entire depth of the semiconductor body 2. In this case, the vacancy density is increased in the region in front of or above the maximum in the region of the depth d and vacancies are produced in the region below or behind the maximum in the region of the depth d. The corresponding doping profile is predefined by the vacancy profile produced.

While here the electron irradiation is described after the proton irradiation, a different order is also possible. By way of example, the electron irradiation can also be effected before the proton irradiation or both can be performed in parallel.

Figure 2D:
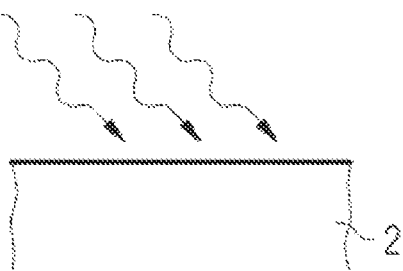
Figure 2F:
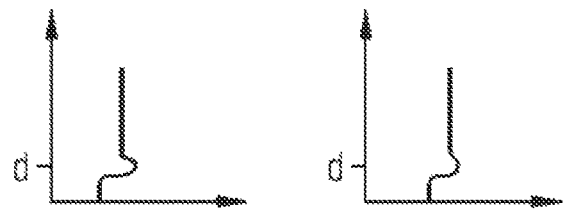
FIG. 2F is another set of two graphs showing doping vacancies.

After the semiconductor body has been irradiated with protons and with electrons, the heat treatment is effected, as illustrated in FIG. 2d. The heat treatment brings about or accelerates annealing of the undesired defects additionally produced during the irradiations, and diffusion of the irradiated protons or hydrogen atoms.

These hydrogen atoms diffuse out from the region around the maximum at the depth d and can be attached to vacancies or vacancy complexes produced. As a result, a more uniform and increased doping distribution can be obtained in accordance with the density of the vacancies, as plotted schematically on the right-hand side of FIG. 2d.

The heat treatment or annealing can be carried out in a temperature range of approximately 300 degrees C. to approximately 600 degrees C. for a few hours. The heat treatment can be carried out for less than approximately 10 hours for example for approximately 3 to 5 hours. A range of between approximately 400 degrees C. and 530 degrees C. is particularly advantageous. By virtue of these comparatively low temperatures for heat treatment, the combined electron and proton irradiation described herein is suitable for being carried out at a late stage in the production process, in particular after the production of the desired semiconductor structure. In this case, the semiconductor body on which the irradiation with protons and/or with electrons is performed can be an already patterned semiconductor wafer. The heat treatment can be effected before or after singulation of the semiconductor wafer into individual semiconductor components.

Further processing steps, e.g. applying further layers, thinning the semiconductor body and/or applying metallization, can succeed or precede the heat treatment.

FIG. 3 shows the projected range or penetration depth of electrons and of protons in silicon during electron and proton irradiation as a function of the respective irradiation energy.

The irradiation energy for proton irradiation and the irradiation energy for electron irradiation can be chosen independently of one another and can be set depending on the desired doping profile. By way of example, the irradiation energy for the electron irradiation can be chosen such that the penetration depth of the electrons corresponds to the penetration depth of protons, such that the doping profiles substantially overlap. This means that the doping efficiency and hence in turn the doping concentration can be significantly increased without altering the extent of the doping profile in comparison with proton irradiation by itself. The difference in concentration between the region through which radiation passes and the maximum can be reduced.

Alternatively, the irradiation energy of the electron irradiation can also be chosen such that the electrons have a greater penetration depth than the protons. In particular, the irradiation energy of the electron irradiation can be chosen with a magnitude such that the maximum penetration depth is greater than the thickness of the semiconductor to be doped, but at least greater than the thickness of the final semiconductor component. By way of example, an irradiation energy of a few MeV, for example 5 to 20 MeV, can be used for the electron irradiation. With irradiation energies for electrons of this order of magnitude, it is possible to achieve largely constant vacancy distributions over the entire thickness of the semiconductor or component.

FIG. 4 shows doping profiles in silicon for combined electron and proton irradiation at different electron doses and, for comparison, a doping profile for proton irradiation without additional electron irradiation. In these examples, the irradiation energy of the protons was 2.5 MeV at an irradiation dose of $4\cdot10^{14}$ cm$^{-2}$. After irradiation with protons and, if appropriate, with electrons, the semiconductors were annealed/subjected to heat treatment at 470° C. for approximately 5 hours. Doping profiles in silicon for an electron irradiation with approximately $10^{14}$ e$^-$/cm$^2$, $3*10^{13}$ e$^-$/cm$^2$, $1*10^{13}$ e$^-$/cm$^2$ and, for comparison, completely without electron irradiation are illustrated in the example illustrated. Whereas without electron irradiation in the region of greater depth behind the maximum penetration depth of the protons even after heat treatment substantially no additional electron doping is produced, the electron irradiation achieves even at these substrate depths a doping concentration which is of the same order of magnitude as, but somewhat lower than, the doping concentration in front of the maximum, for example approximately 90% to 95% of the doping concentration in front of the maximum. The doping concentration in the region of greater depth than the maximum can be approximately 50% or more of the doping concentration at lesser depth before the maximum. It is advantageous if the doping concentration in the region of greater depth than the maximum can be 70% or more, in particular 85% or more, of the doping concentration at lesser depth before the maximum.

The maximum of the doping concentration produced is situated in the region of the maximum penetration depth of the protons and the position is independent of the electron irradiation. However, the doping concentration and distribution can be varied depending on the heat treatment temperature and duration. The electron dose furthermore also influences the doping concentration in the region of smaller depths or before the maximum. By means of the electron irradiation, the doping concentration can be increased there and a more uniform distribution of the doping over the entire width can be achieved. As shown, given an electron dose of $10^{14}$ e$^-$/cm$^2$ it is possible to achieve a doping concentration in the region between the semiconductor front side through to the maximum of approximately $3\cdot10^{14}$ donors per cm$^3$, which is substantially constant in this region. Consequently, the proposed method makes it possible to achieve higher and more uniform doping distributions with proton irradiation in silicon and other materials. A minimum of the doping concentration in the region of a depth before the maximum (at approximately 60-80% of the depth $R_P$) can be avoided.

The parameters mentioned are merely by way of example for the profiles shown and can be adapted to the components in accordance with the requirements. By way of example, the maximum can be set by adapting the irradiation energy of the protons. With a variation of approximately 1 MeV to approximately 10 MeV, it is possible to set the position of the maximum in the region of a depth of approximately 10 μm to approximately 1 mm. Particularly good results can be achieved with energies in a range of approximately 1 MeV to approximately 4 MeV.

The electron dose can likewise be set in such a way that a desired doping concentration is achieved. The electron dose can be in the range of $10^{12}$ e$^-$/cm$^2$ to $10^{14}$ e$^-$/cm$^2$ at electron incidence energies in the range of a few MeV, e.g. 5 to 20 MeV.

Depending on the application and the desired doping profile, the maximum can lie within or outside the semiconductor. Provision can also be made for removing or otherwise thinning the semiconductor after doping to an extent such that the maximum is removed and the semiconductor is thinner than the penetration depth of the protons.

Depending on the application, it can also be advantageous to provide the maximum within the semiconductor. By way of example, a region having higher doping in diodes can be very advantageous for achieving a soft turn-off process. However, a corresponding doping profile may also be desirable in other components.

The invention claimed is:

1. A semiconductor component having a first and a second side, said semiconductor component comprising at least one n-doped section having a distribution of a doping concentration in the direction from the first side to the second side which has a first region having a first substantially constant doping concentration and a second region having a second substantially constant doping concentration, wherein the distribution of the doping concentration has a maximum between the first region and the second region, and wherein the maximum of the doping concentration is greater than $2.5\times10^{14}$ cm$^{-3}$.

2. The semiconductor component according to claim 1, wherein the first substantially constant doping concentration is approximately $3\times10^{13}$ cm$^{-3}$ or greater over the first region.

3. The semiconductor component according to claim 1 wherein the second substantially constant doping concentration is less than the first substantially constant doping concentration.

4. The semiconductor component according to claim 3, wherein the second substantially constant doping concentration is 50% or more of the first substantially constant charge carrier concentration.

5. The semiconductor component according to claim 1, further comprising at least one p-doped region which is arranged in a manner adjoining the first region having the first substantially constant doping concentration.

6. The semiconductor component according to claim 1, further comprising at least one p-doped region which is arranged in a manner adjoining the second region having the second substantially constant doping concentration.

7. The semiconductor component according to claim 1, wherein at least the semiconductor body comprises silicon.

* * * * *